United States Patent
Yang et al.

[11] Patent Number: 6,140,240
[45] Date of Patent: Oct. 31, 2000

[54] METHOD FOR ELIMINATING CMP INDUCED MICROSCRATCHES

[75] Inventors: Fu-Liang Yang, Tainan; Bih-Tiao Lin, Ping-Tung; Tzu-Shih Yen, Hsinchu; Bi-Ling Chen, Taipei; Erik S. Jeng, Hsinchu, all of Taiwan

[73] Assignee: Vanguard International Semiconductor Corporation, Hsin-Chu, Taiwan

[21] Appl. No.: 09/226,275

[22] Filed: Jan. 7, 1999

[51] Int. Cl.⁷ .................................................. H01L 21/302
[52] U.S. Cl. .................... 438/692; 438/694; 438/697; 438/699; 438/706; 438/723
[58] Field of Search ..................... 438/697, 692, 438/706, 723, 743, 780, 788, 787, 694, 699, 710

[56] References Cited

U.S. PATENT DOCUMENTS

| | | | |
|---|---|---|---|
| 4,894,351 | 1/1990 | Batty | 438/624 |
| 5,312,512 | 5/1994 | Allman et al. | 156/636 |
| 5,332,694 | 7/1994 | Suzuki | 438/624 |
| 5,403,780 | 4/1995 | Jain et al. | 438/624 |
| 5,429,070 | 7/1995 | Campbell et al. | 118/723 R |
| 5,516,729 | 5/1996 | Dawson et al. | 438/623 |
| 5,585,673 | 12/1996 | Joshi et al. | 257/751 |
| 5,639,345 | 6/1997 | Huang et al. | 438/699 |
| 5,702,980 | 12/1997 | Yu et al. | 438/623 |
| 5,712,205 | 1/1998 | Park et al. | 438/425 |
| 5,721,173 | 2/1998 | Yano et al. | 438/424 |
| 5,728,621 | 3/1998 | Zheng et al. | 438/427 |

*Primary Examiner*—Felisa Hiteshen
*Assistant Examiner*—Binh X. Tran
*Attorney, Agent, or Firm*—George O. Saile; Stephen B. Ackerman

[57] ABSTRACT

A method of removing microscratches in planarized dielectric surfaces covering conductor layers in submicron integrated circuit structures includes a semiconductor substrate having at least one dielectric layer formed thereon followed by a chemical mechanical polishing process for planarization. The removal of microscratches includes depositing a PE-CVD polymer layer to fill the microscratches, caused by CMP planarization, and to cover the planarized dielectric surface with a thin layer of the polymer. Deposition is followed by introducing an etching gas into the CVD chamber for an etch back of the just deposited polymer to well below the depth of the microscratches wherein the deposited polymer has the same etch rate as the dielectric layer formed thereunder.

17 Claims, 1 Drawing Sheet

METHOD FOR ELIMINATING CMP INDUCED MICROSCRATCHES

BACKGROUND OF THE INVENTION (1) Technical Field

This invention relates to a method for planarizing an integrated circuit device, and more particularly, to a method of planarizing a submicron integrated circuit device by eliminating micro scratches after a chemical mechanical polishing process.

(2) Description of the Prior Art

The following four documents relate to methods dealing with semiconductor isolation for improving the isolation characteristics of semiconductor devices prior to planarizing by chemical mechanical polishing.

U.S. Pat. No. 5,728,621 issued Mar. 17, 1998 to Zheng et al., shows a method of CMP where a SOG layer is coated over the oxide.

U.S. Pat. No. 5,721,173 issued Feb. 24, 1998 to Yano et al., shows another CMP process using a SiN stop layer.

U.S. Pat. No. 5,712,205 issued Jan. 27, 1998 to Park et al., shows a selectively CMP isolation areas on portions of a wafer.

U.S. Pat. No. 5,312,512 issued May 17, 1994 to Allman et al., teaches a method for planarizing which employs spin on glass (SOG) and an etching operation to remove high portions of the SOG prior to a chemical mechanical polish (CMP) operation. The SOG is baked and cured before etching. Additional layers of SOG and etching operations may be employed as necessary. A thick encapsulating oxide layer is deposited over the SOG layer. For surface irregularities caused by methyl lines, an insulating layer may be deposited over the surface before the SOG. Where an additional metal line is to be deposited on the surface, an additional insulating layer is deposited after the CMP operation. In the case of metal lines made of aluminum, provision is also made for preventing Hillock formations on metal lines.

The fabrication of integrated circuits on a semiconductor wafer involves a number of steps where patterns are transferred from photolithographic photomasks onto the wafer. The photomasking processing steps opens selected areas to be exposed on the wafer for subsequent processes such as inclusion of impurities, oxidation, or etching.

During the forming of integrated circuit structures, it has become increasingly important to provide structures having multiple metallization layers due to the continuing miniaturization of the circuit elements in the structure. Each of the metal layers is typically separated from another metal layer by an insulation layer, such as an oxide layer. To enhance the quality of an overlying metallization layer, one without discontinuities of other blemishes, it is imperative to provide an underlying surface for the metallization layer that is ideally planar. The process of planarization is necessary and desirable to facilitate masking and etching operations. Planarization of metal interconnect layers improves the yield of devices contained in the device array of a wafer, and the reliability of such devices. Planarization produces a constant thickness across the circuit of a die, minimizes the presence of cavities, and allows metal interconnect lines to be continuous, where they would otherwise be discontinuous over a non-planar surface containing cavities.

To meet the demand for larger scale integration, and more metal and oxide layers in devices and the exacting depth of focus needed for submicron lithography, a new planrization method, known as chemical mechanical polishing (CMP), was developed and is presently used by most major semiconductor manufacturers. CMP planarization of a wafer involves supporting and holding the wafer against a rotating polishing pad wet with a polishing slurry and at the same time applying pressure. Unlike the conventional planarization techniques, CMP provides a substantially improved overall planarization, that is, an improvement of 2 to 3 orders of magnitude over conventional methods. Although CMP planarization is effective, most CMP techniques have difficulties providing trouble free device patterns. Surface microscratches are formed during CMP planarization. These surface anomalies are caused by submicron size silica contained in the polishing slurry.

SUMMARY OF THE INVENTION

It is therefore a primary object of the present invention to provide a submicron integrated circuit device by eliminating micro scratches after a chemical mechanical polishing process.

Another object of the present invention is to provide a method of planarizing an integrated circuit device which does not result in cracks in the resulting intermetal dielectric.

Another object of the present invention is to provide a method of planarizing an integrated circuit device which does not result in voids between devices.

Yet another object of the present invention is to provide a method of planarizing an integrated circuit which does not result in surface contamination caused by CMP.

It is still another object of the present invention to provide the method capable of high yield in fabricating a semiconductor device.

It is an additional object of the present invention to provide the method, useful in a semiconductor device having large scale integration.

In accordance with the objects of this invention a new method of planarizing an integrated circuit is achieved. The method employs a sacrificial PE-CVD polymer to fill the chemical mechanical polish(CMP) induced scratches in the dielectric layer covering the metal conductors. After CMP, the semiconductor substrate is placed in a CVD chamber depositing thereover a thin layer of polymer to a thickness of between about 0.1 to 0.51 $\mu$m thus filling the micro scratches. The polymer is etched back to well below the micro scratch level thereat producing a scratch-free planarized surface. Both the polymer deposition and etch back are performed in the same CVD chamber under the following process parameters.

RF power: 300–800 watt,

Gas Pressure: 100–500 mTorr,

Reactive gases: $C_4F_8/CHF_3/CO/Ar/N_2$,

The etching gas is based on $CF_4$ with additional $CHF_3$ (10–50%) and $O2$(10–50%).

This process results in excellent planarity with no micro scratches on the planarized surface.

DETAILED DESCRIPTION OF THE PREFERRED EMBODIMENT

Thin films must be deposited, modified in some cases, patterned, adjusted in some cases, and must be provided with contacts before they can perform useful electronic functions. The thin film elements and their interconnections must be compatible with the rest of the integrated circuit in which they appear, with the various chemical and thermal processing and sealing steps, and must withstand accelerated life-test procedures. In other words, we must be able to treat thin film and component parts of an integrated circuit as equivalent with respect to some processing steps, all packaging steps and in reliability expectations.

Figure 1:
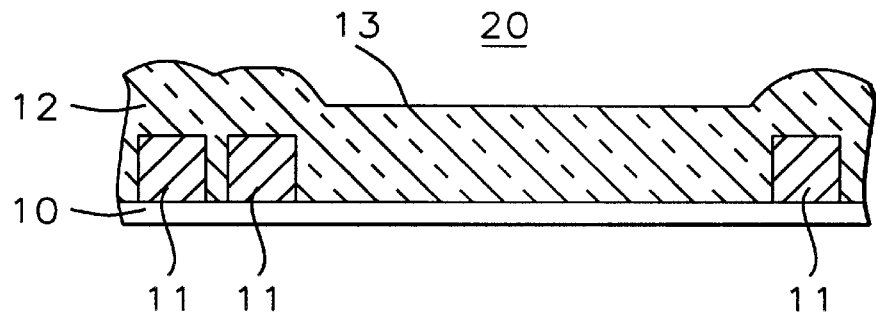
FIG. 1 schematically illustrates in cross-sectional representation a partially completed integrated circuit prior to a chemical mechanical polishing process, of the prior art.
Figure 2:
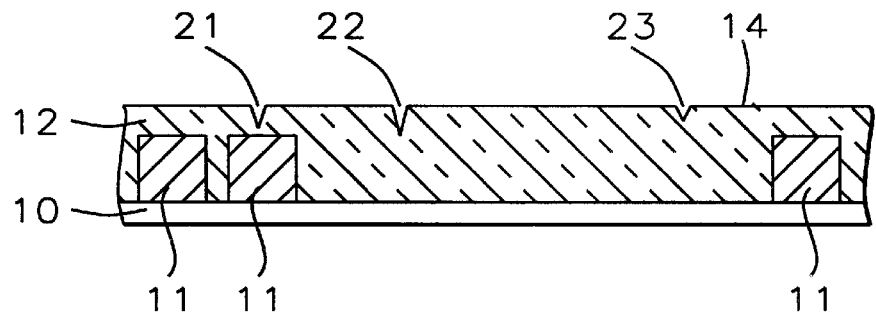
FIG. 2 schematically illustrates in cross-sectional representation a partially completed integrated circuit indicating the problems to be overcome by the present invention.

Referring now more particularly to FIG. 1, there is shown an illustration of a partially completed, integrated circuit 20 including raised features which are shown as metal conductor lines 11 on a semiconductor wafer 10. This figure illustrates the difficulty in forming a thin film over raised features during the manufacturing process. For surface irregularities caused by the raised metal conductor lines 11, an insulating dielectric 12 is deposited over the surface. The insulating dielectric 12 encapsulates and protects the metal conductor lines 11 from ambient, sometimes corrosive, elements. The non-uniform topology 13 of the dielectric layer is then planarized using a chemical mechanical polishing (CMP) process. A uniform topology 14 of the dielectric 12 is necessary and desirable since a planarized surface will provide a constant depth of focus for exposing subsequent patterns in a photolithographic process and will enhance the manufacturer's ability to form highly integrated semiconductor devices. FIG. 2 shows the more uniform topology 14 created after the CMP process is complete but with microscratches 21, 22, 23, and the like, inherent in the process appearing on the planarized surface. The scratches will vary in depth from 0.1 to 1.0 $\mu$m. Microscratches arising from the chemical mechanical polishing process create defects which can result in circuit failure. This invention which eliminates the microscratches produced during CMP processing, will greatly reduce yield loss from CMP induced microscatches also eliminate surface contamination due to CMP.

Figure 3:
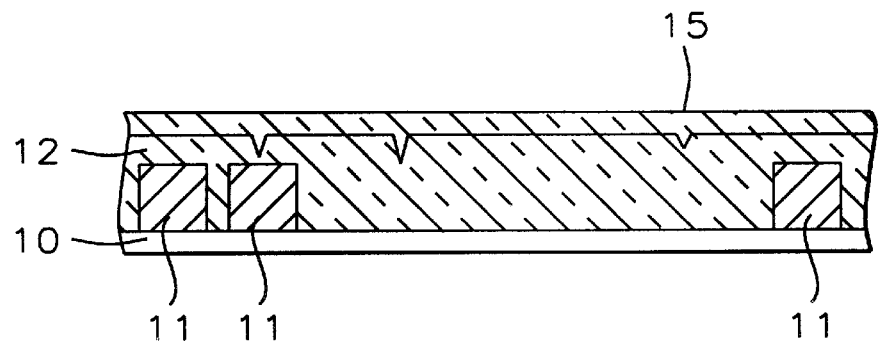
FIGS. 3, and 4 schematically illustrate in cross-sectional representation one preferred embodiment of the invention.
Figure 4:
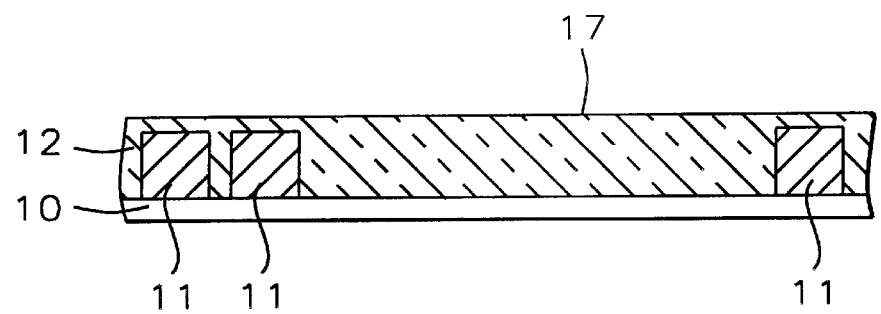

Referring now to FIGS. 3 and 4 illustrating the steps for removing microscratches 21 in planarized dielectric surfaces 14. The dielectric surface layers 12 cover conductor layers 11 in submicron integrated circuit structures.

A semiconductor substrate 10 is provided having at least one deposited dielectric layer 12 that is formed and planarized 14. The substrate 10 is loaded into a chemical vapor deposition apparatus, not shown, and a sacrificial PE-CVD polymer layer 15 is deposited over the planarized dielectric 14 while filling the CMP induced microscratches 21. The polymer 15 is deposited to a layer thickness of between about 0.1–0.5 $\mu$m.

Depositing the PE-CVD polymer layer 15 has conditions of; RF power between about 300–800 Watt, Pressure between about 100–500 mTorr, and reactive gases comprising $C_4F_8/CHF_3/CO/Ar/N_2$.

After deposition of the PE-CVD polymer 15, an etching gas is provided to etch back the deposited polymer to a depth that is well below the depth of the microscratches that measure between about 0.1–1.0 $\mu$m. The etching gas has ambient factors which are based on $CF_4$ gas by adding between about 10 to 50% of $CHF_3$ gas and between about 10 to 50% of $O_2$ gas. Etching back is accomplished at an etching rate that is the same as the etching, rate for the dielectric layer that is formed thereunder. The etch back produces a flaw free planarized surface 17 that prevents circuit failure caused by contamination entering the microscratches 21. By achieving both deposition and etch back of the PE-CVD polymer 15 in the same CVD chamber without having to remove and reload the semiconductor wafer 10 reduces wafer handling while increasing product throughput.

In conclusion, the CMP process alone is not acceptable because of microscratches causing, yield loss and surface contamination. The sacrificial polymer sandwich is not acceptable because of irregular planarity. The integrated process of the present invention provides a surface with no scratches and excellent planarity.

While the invention has been particularly shown and described with reference to the preferred embodiments thereof, it will be understood by those skilled in the art that various changes in form and details may be made without departing from the spirit and scope of the invention.

What is claimed is:

1. A method for removing microscratches in planiarized dielectric surfaces covering conductor layers in submicron integrated circuit structures, comprising the steps of:

providing a semiconductor substrate including at least one dielectric layer formed and planarized thereover;

providing a chemical vapor deposition apparatus for depositing a PE-CVD polymer layer to fill said microscratches on said planarized dielectric layer;

wherein said depositing a PE-CVD Polymer layer has conditions: RF between about 300–800 Watts, Pressure between about 100–500 mTorr, Reactive Gases=$C_4F_8/CHF_3/CO/Ar/N_2$; and etching back well below depth of said microscratches.

2. The method of claim 1 wherein said microscratches in planarized dielectric surfaces measure between about 0.1–1.0 $\mu$m deep, said microscratches are induced during CMP planarization.

3. The method of claim 1 wherein depositing said PE-CVD polymer layer has a thickness of between about 0.1–0.5 $\mu$m.

4. The method of claim 1 wherein circuit failure caused by contamination ingressing said microscratches is eliminated.

5. The method of claim 1 whereby a chemical vapor deposition chamber is used for polymer deposition and plasma etch back reduces wafer handling and increases production.

6. The method of claim 1 wherein etching back said PE-CVD polymer layer has ambient factors based on $CF_4$ gas by adding between about 10 to 50% of $CHF_3$, gas and between about 10 to 50% of $O_2$ gas.

7. The method of claim 6 wherein etching back is accomplished at an etching rate that is the same as the etching rate for the dielectric layer formed thereunder.

8. A method for removing defects in planarized dielectric surfaces covering conductor layers in submicron integrated circuit structures, comprising the steps of:

providing a semiconductor substrate including at least one dielectric layer formed and planarized thereover;

providing a chemical vapor deposition apparatus for depositing a PE-CVD polymer layer to fill said defects on said planarized dielectric layer;

wherein said depositing a PE-CVD polymer layer has conditions: RF between about 300–800 Watts, Pressure between about 100–500 mTorr, Reactive Gases=$C_4F_8/CHF_3/CO/Ar/N_2$; and after depositing said PE-CVD polymer layer, while still in said CVD apparatus, etching back said deposited polymer well below depth of said defects.

9. The method of claim 8 wherein the dielectric layer is a conformably deposited oxide.

10. The method of claim 8 wherein the defects include microscatches.

11. The method of claim 8 wherein said defects, after planarization, measure between about 0.1–1.0 µm deep.

12. The method of claim 8 wherein depositing said PE-CVD polymer layer has a thickness of between about 0.1–0.5µm.

13. The method of claim 8 wherein circuit failure caused by contamination ingressing said defects is eliminated.

14. The method of claim 8 whereby a chemical vapor deposition chamber is used for polymer deposition and plasma etch back reduces wafer handling and increases production.

15. The method of claim 8 wherein etching back said PE-CVD polymer layer has ambient factors based on $CF_4$ gas by adding between about 10 to 50% of $CHF_3$ gas and between about 10 to 50% of $O_2$ gas.

16. The method of claim 15 wherein etching back is accomplished at an etching rate that is the same as the etching rate for the dielectric layer formed thereunder.

17. The method of claim 16 wherein said dielectric layer is selected from the group of materials consisting of borophosphosilicate glass and an oxide.

* * * * *